(12) United States Patent
Kim et al.

(10) Patent No.: US 7,049,236 B2
(45) Date of Patent: May 23, 2006

(54) METHOD OF MANUFACTURING A SEMICONDUCTOR DEVICE

(75) Inventors: Jum Soo Kim, Ichon-Shi (KR); Jung Ryul Ahn, Namyangj-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 300 days.

(21) Appl. No.: 10/623,341

(22) Filed: Jul. 18, 2003

(65) Prior Publication Data

US 2004/0097080 A1    May 20, 2004

(30) Foreign Application Priority Data

Nov. 18, 2002    (KR) .................... 10-2002-0071503

(51) Int. Cl.
*H01L 21/302*    (2006.01)
(52) U.S. Cl. .................. 438/691; 438/211; 438/706
(58) Field of Classification Search ............ 438/706, 438/710, 712, 714, 745, 211, 217, 257, 258, 438/7.1, 212, 691, 692
See application file for complete search history.

(56) References Cited

U.S. PATENT DOCUMENTS

| | | | |
|---|---|---|---|
| 6,200,856 B1 * | 3/2001 | Chen | 438/257 |
| 6,242,303 B1 * | 6/2001 | Wang et al. | 438/257 |
| 6,461,915 B1 * | 10/2002 | Rudeck | 438/257 |

FOREIGN PATENT DOCUMENTS

JP    2001-284556    10/2001

* cited by examiner

*Primary Examiner*—Lan Vinh
(74) *Attorney, Agent, or Firm*—Marshall, Gerstein & Borun LLP

(57) ABSTRACT

Disclosed is a method of manufacturing a semiconductor device. A gate electrode, which was formed through existing mask and etch processes, is formed by forming an oxide film protrusion on a field oxide film and forming the gate electrode between the oxide film protrusions. It is thus possible to minimize the critical dimension of the device, easily adjust the size of the device and form a uniform gate electrode over the wafer.

19 Claims, 4 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, and more particularly, to a method of forming a floating gate in a flash memory device by which the floating gate is formed in the self-aligned mode.

2. Background of the Related Art

Recently, as the design rule is reduced and the size of the device is reduced, it is difficult to control overlapping of a field oxide film (FOX) that has the greatest influence on the distance between the floating gates and coupling in the ETOX (EEPROM tunnel oxide) cell. In general, the flash memory cell is implemented using the STI process. Upon isolation of the floating gate, the uniformity of the wafer depending on variation of the critical dimension (CD) is not easy in the patterning process using the mask. For this reason, there is a problem that the coupling ratio between the devices is not uniform. Furthermore, if a high bias voltage is applied during the programming or erasing operation of the flash memory devices, defective flash memory devices may occur due to a uniform floating gate. In addition, the production yield is degraded and the cost price is increased, due to misalignment between the isolation mask and the poly mask and an increased mask process.

SUMMARY OF THE INVENTION

Accordingly, the present invention is contrived to substantially obviate one or more problems due to limitations and disadvantages of the related art.

An object of the present invention is to provide a method of manufacturing a semiconductor device capable of forming a floating gate without using the mask process and forming the floating gate of a small size, in such a manner that in a state that a tunnel oxide film and first polysilicon film for forming a floating gate are deposited, a patterning process is implemented to form an isolation film of a STI structure and a second polysilicon film is deposited on the first polysilicon film, thus forming a floating gate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing a semiconductor device according to the present invention is characterized in that it comprises the steps of sequentially forming a tunnel oxide film, a first polysilicon film and a pad nitride film on a semiconductor substrate, etching portions of the pad nitride film, the first polysilicon film, the tunnel oxide film and the semiconductor substrate by means of a patterning process to form a trench within the semiconductor substrate, depositing an oxide film on the entire structure including the trench and then planarization the oxide film so that the pad nitride film is exposed, etching the pad nitride film to form an oxide film protrusion, depositing a second polysilicon film on the entire structure and then planarization the second polysilicon film so that the oxide film protrusion is exposed, and etching a part of the exposed oxide film protrusion to form a floating gate, and then forming a dielectric film and a control gate.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1A:
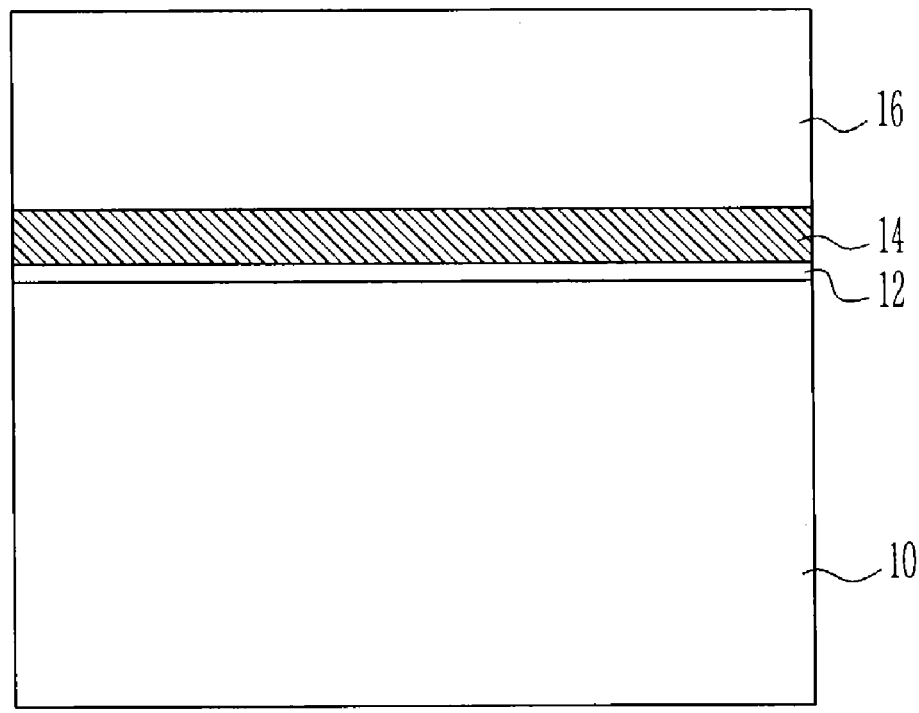
FIG. 1A~FIG. 1G are cross-sectional views of semiconductor devices for explaining a method of manufacturing the device.

Reference will now be made in detail to the preferred embodiments of the present invention, examples of which are illustrated in the accompanying drawings, in which like reference numerals are used to identify the same or similar parts.

FIG. 1A~FIG. 1G are cross-sectional views of semiconductor devices for explaining a method of manufacturing the device.

Referring now to FIG. 1A, a screen oxide film (not shown), which is necessary for prohibition of crystal defects on the substrate surface or surface treatment and serves as a buffer layer upon implantation of ions, is deposited on a semiconductor substrate 10. Ion implantation is then implemented to form a well. After the screen oxide film is removed, a tunnel oxide film 12, a first polysilicon film 14 and a pad nitride film 16 are deposited.

In more concrete, before the screen oxide film is formed, in order to clean the semiconductor substrate 10, a pretreatment cleaning process is implemented using DHF (dilute HF) in which $H_2O$ and HF are mixed at the ratio of 50:1 and SC-1 (standard cleaning-1) consisting of $NH_4OH$, $H_2O_2$ and $H_2O$, or BOE (buffered oxide etchant) in which $NH_4F$ and HF are mixed at the ratio of 100:1~300:1 and SC-1 consisting of $NH_4OH$, $H_2O_2$ and $H_2O$. Dry or wet oxidization process is implemented at a temperature of 750~800° C. to form the screen oxide film of 30~100 Å in thickness.

After the ion implantation, the screen oxide film is etched using DHF in which $H_2O$ and HF are mixed at the ratio of 50:1 and SC-1 consisting of $NH_4OH$, $H_2O_2$ and $H_2O$. Next, the tunnel oxide film 12 is formed in thickness of 85~110 Å by means of a wet oxidization method at a temperature of 750~800° C. After deposition of the tunnel oxide film 12, an annealing process is implemented using $N_2$ at a temperature of 900~910° C. for 20~30 minutes. Thereby, the defect density at the interface between the tunnel oxide film 12 and the semiconductor substrate 10 is minimized.

A first polysilicon film 14 having thickness of 200~1000 Å is deposited on the tunnel oxide film 12 using $SiH_4$ or $Si_2H_6$ and $PH_3$ gas by means of a chemical vapor deposition (CVD), a low pressure CVD (LPCVD), a plasma enhanced CVD (PECVD) or an atmospheric pressure CVD (APCVD) method at a temperature of 530~680° C. under a pressure of 0.1~3.0 torr. Due to this, as the granularity of the first polysilicon film 14 is minimized, it is possible to prevent concentration of an electric field. Next, a pad nitride film 16 having a thickness of about 1300~3000 Å is formed on the first polysilicon film 14 by means of the LP-CVD method.

Figure 1B:
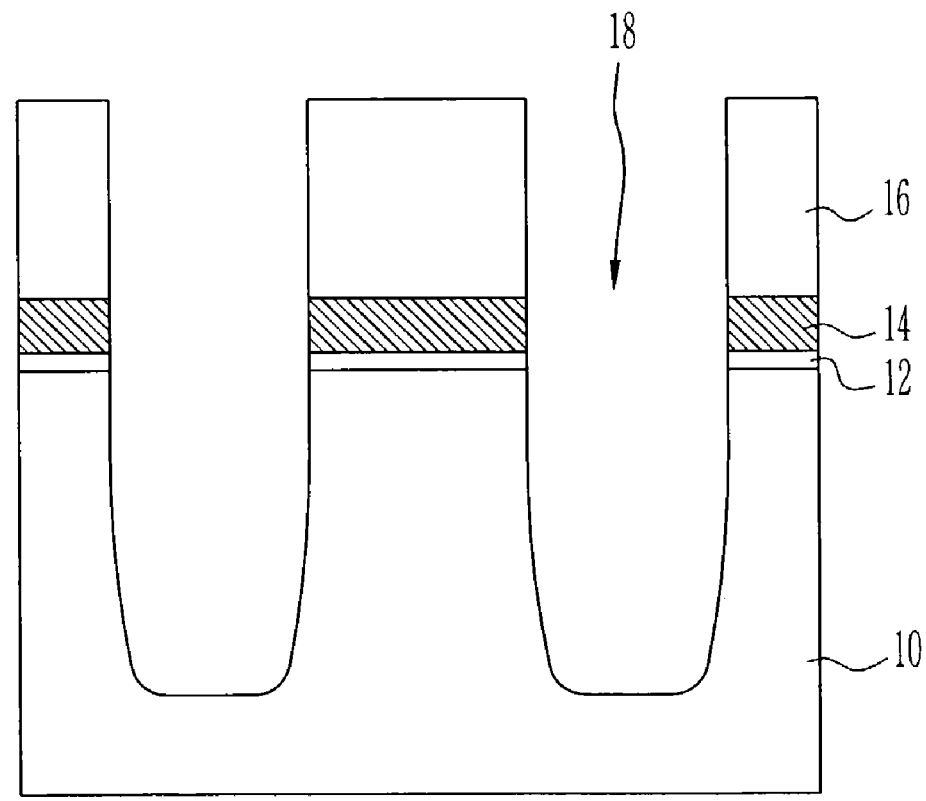

Referring to FIG. 1B, the pad nitride film 16, the first polysilicon film 14, the tunnel oxide film 12 and the semiconductor substrate 10 are sequentially etched through ISO mask patterning, to form a trench 18 of a STI (shallow trench isolation) structure, so that an active region and a field region are defined. A dry oxidization process for compensating for etch damage of the sidewall of the trench 18 of the STI structure is implemented. A rapid thermal process is also implemented to make rounded the corners of the trenches 18. High temperature oxide (HTO) is thinly deposited on the entire structure and a densification process is implemented at high temperature to form a liner oxide film (not shown).

In concrete, after a photoresist film is covered on the entire structure, a photolithography process using a photoresist film mask is implemented to form a photoresist film pattern (not shown). An etch process using the photoresist film pattern as an etch mask is then implemented to etch the pad nitride film 16, the first polysilicon film 14, the tunnel oxide film 12 and the semiconductor substrate 10, thus forming the trench 18 of the STI structure. For the purpose of compensating for damage of the sidewall of the trench 18 due to the etch process, a dry oxidization process is implemented within a temperature range of 800~1000°° C., thereby forming a sidewall oxide film of 50~150 Å in thickness.

A rapid thermal process (RTP) using hydrogen is implemented (using a property that atoms of the semiconductor substrate are moved) to make rounded the corner and edged elements of the trench. It is thus possible to prohibit concentration of the electric field and improve the device operating characteristic. At this time, the RTP is implemented by introducing a hydrogen gas of 100~2000 sccm at a temperature of 600~1050° C. under a pressure of 300~380 torr for 5~15 minutes in a fast thermal process (FTP) type equipment.

In order to improve an adhesive characteristic between the oxide film and the trench 18 in a subsequent process and prevent generation of a moat, HTO formed using DCS (dichloro silane; $SiH_2Cl_2$) gas is deposited in thickness of 50~150 Å, A high temperature densification process is then implemented using $N_2$ at a temperature of 1000~1100° C. for 20~30 minutes to form a liner oxide film (not shown). The tissue of the liner oxide film is made dense by the high temperature densification process. Accordingly, an etch resistance is increased, formation of the moat is prohibited upon implementation of STI and the leakage current is prevented.

Figure 1C:
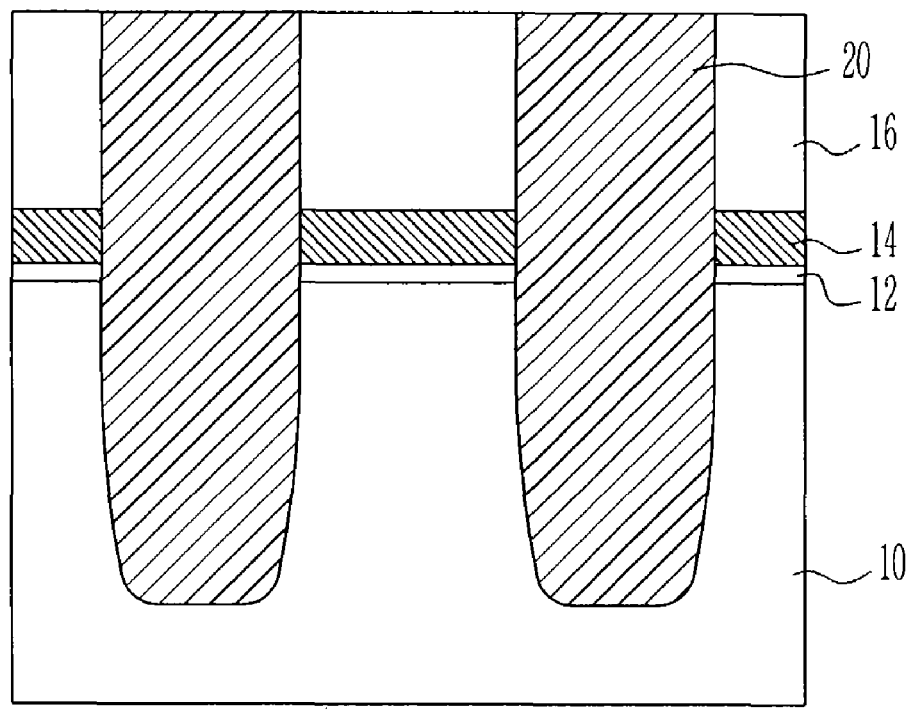

Referring to FIG. 1C, a high density plasma (HDP) oxide film 20 is deposited on the entire structure to bury the trench 18. A planarization process using the pad nitride film 16 as a stop layer is then implemented. A planarization process for removing the HDP oxide film 20 and the liner oxide film on the pad nitride film 16 is implemented using the pad nitride film 16 as an etch stop layer.

In more concrete, in order to fill the gap of the trench 18, the HDP (high density plasma) oxide film 20 is formed in thickness of 5000~10000 Å. At this time, the HDP oxide film 20 is deposited so that an empty gap is not formed within the trench 18.

After a planarization process using CMP is implemented, a post cleaning process using BOE or HF is implemented in order to remove the oxide film that may remain on the pad nitride film 16. At this time, it is strongly recommended that reduction in the height of the HDP oxide film 20 due to over-etch should be prohibited by maximum.

Figure 1D:
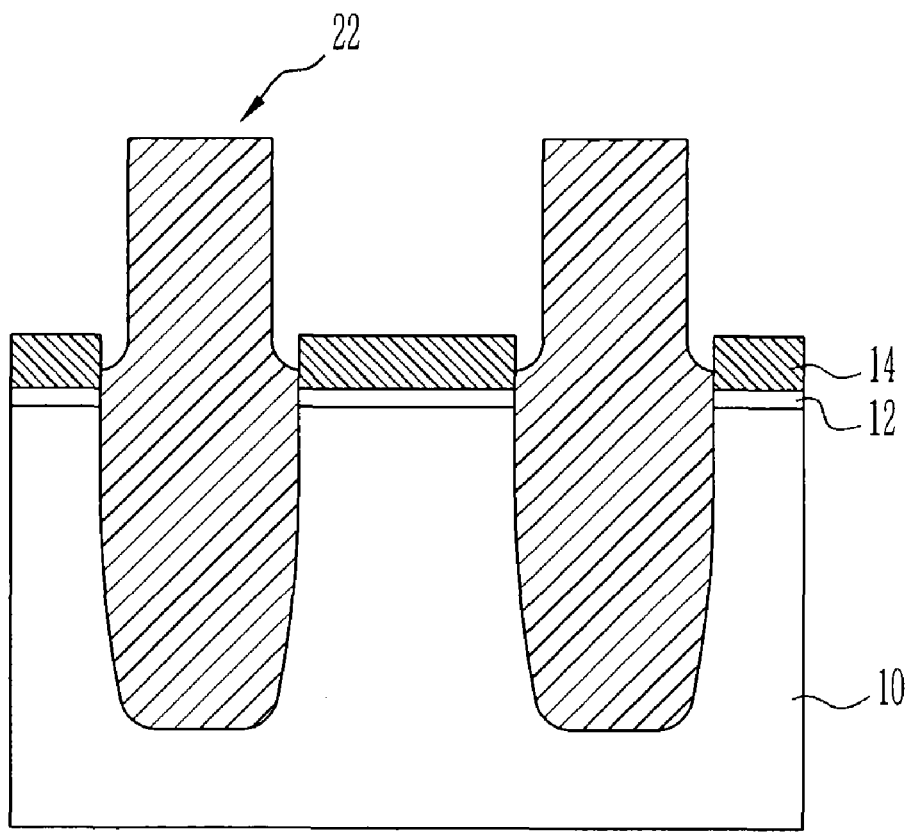

Referring to FIG. 1D, the pad nitride film 16 is experienced by a nitride strip process using $H_3PO_4$ dip out, thereby forming a HDP oxide film protrusion 22. When the pad nitride film 16 is tripped, it is required that the height of the HDP oxide film protrusion 22 from the first polysilicon film 14 be about 700~2500 Å. At this time, it is preferred that the step between the first polysilicon film 14 and the field oxide film has a thickness used in a second polysilicon film formed in a subsequent process plus a small thickness of about 200~300 Å.

Figure 1E:
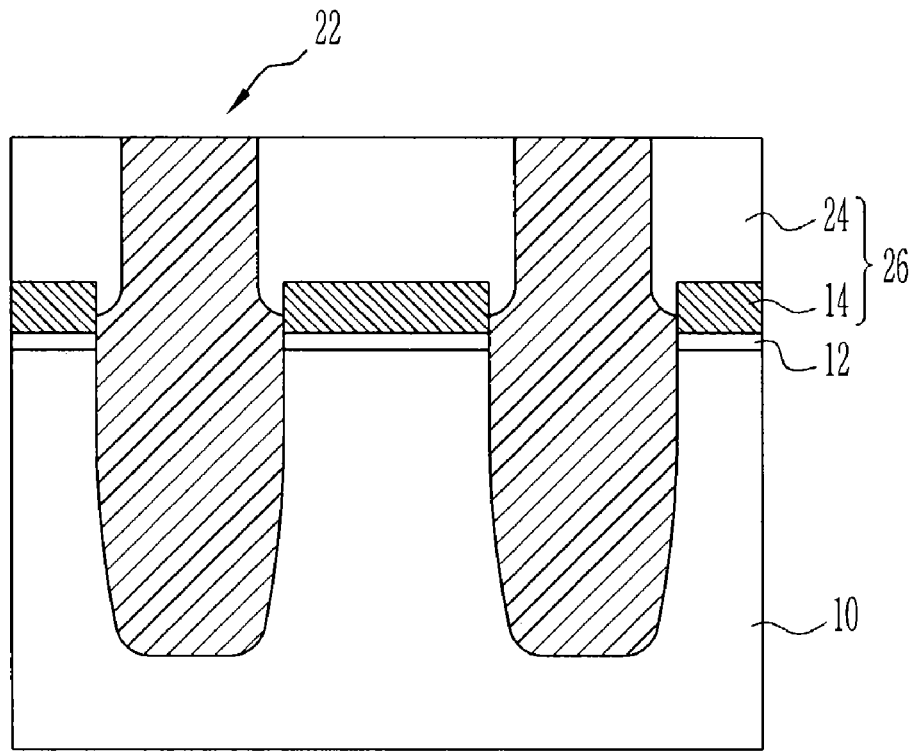

Referring to FIG. 1E, after a pre-treatment cleaning process is implemented, a second polysilicon film 24 is deposited on the entire structure. A planarization process is then implemented to remove the second polysilicon film 24 formed on the HDP oxide film protrusion 22, thereby forming a floating gate electrode 26.

In concrete, a pre-treatment wet cleaning process using DHF and SC-1 is implemented to form an overlapped portion between the field oxide film and the polysilicon film. At this time, it is possible to prevent formation of a moat in the cell region and loss of the tunnel oxide film 12 below the first polysilicon film 14, by controlling a wet cleaning time. Also, the wet cleaning process may be controlled so that ⅔ of the thickness of the first polysilicon film 14 (100~700 Å) is opened.

Thereafter, the second polysilicon film 24 having the same material to the first polysilicon film 14 is deposited in thickness of 800~2500 Å to bury the HDP oxide film protrusion 22. In order to prevent deviation that may occur in the planarization process using CMP, a buffer layer (not shown) such as PE-TEOS (plasma enhanced tetra ethyle ortho silicate), PE-Nit, PSG (phosphorus silicate glass) and BPSG (boron phosphorus silicate glass) is formed by means of the PE-CVD method. At this time, the buffer layer is deposited in thickness of 100~1000 Å.

The buffer layer and the second polysilicon film 24 on the HDP oxide film protrusion 22 are removed by the chemical mechanical polishing (CMP) process and the second polysilicon film 24 is thus isolated. Accordingly, a floating gate electrode 26 consisting of the first and second polysilicon films 14 and 24 is formed. Furthermore, the CMP process is implemented so that the floating gate electrode (total thickness of the first and second polysilicon films) remains uniformly in thickness of 1000~2500 Å.

Figure 1F:
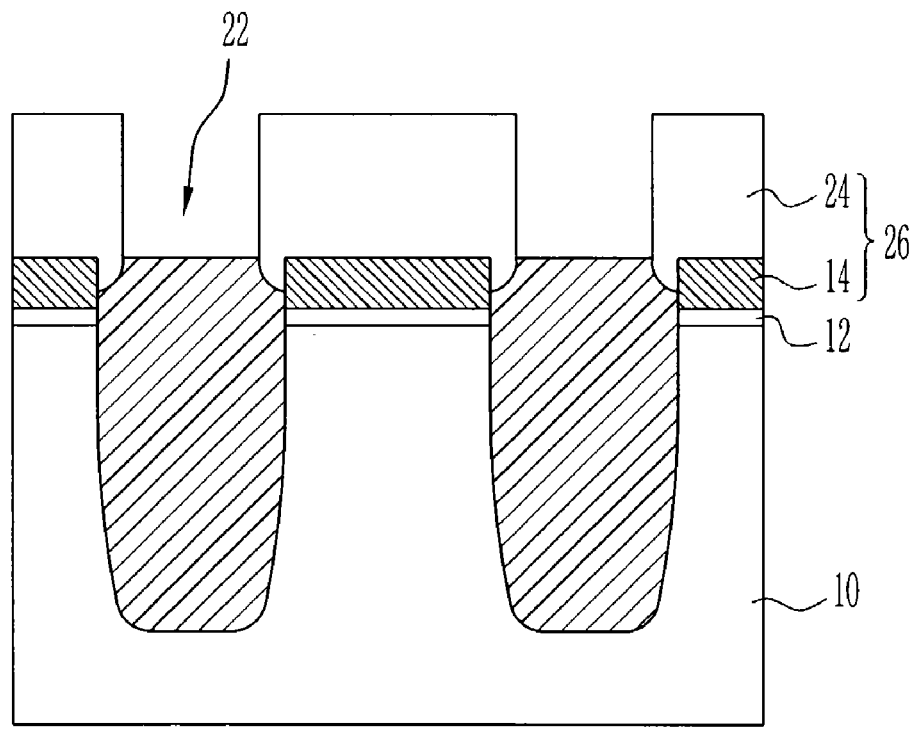

Referring to FIG. 1f, after the CMP process, the exposed HDP oxide film protrusion 22 is removed in thickness of 500~2000 Å by means of a pre-treatment cleaning process using HF or BOE. This allows the width and surface area of the floating gate electrode 26 to be smaller than when being implemented using the existing masking process, so that the coupling ratio can be high.

Figure 1G:
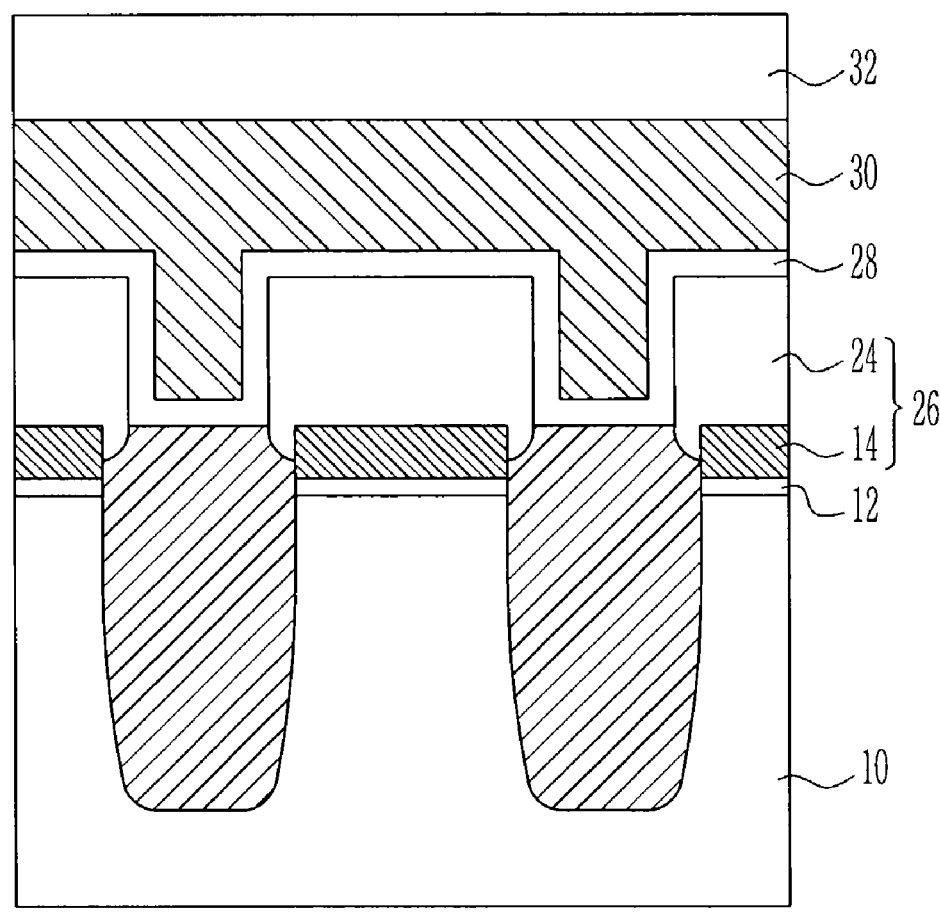

By reference to FIG. 1G, a dielectric film 28 is formed along the step of the entire structure. A third polysilicon film 30 and a tungsten suicide (Wsi) film 32 for forming the control gate are then sequentially deposited.

In concrete, the dielectric films of various shapes used in the semiconductor devices may be deposited. In the present embodiment, however, the dielectric film 28 of an ONO (oxide film/nitride film/oxide film ($SiO_2$—$Si_3N_4$—$SiO_2$)) or ONON structure is deposited. In the dielectric film 28 of the ONO structure, the oxide film in the ONO structure is deposited in thickness of about 35~60 Å using DCS ($SiH_2Cl_2$) and $N_2O$ gas having good withstanding voltage and TDDB characteristic under a low pressure of 0.1~3 torr at a temperature of about 810~850° C. by means of the LP-CVD method. Also, the nitride film in the ONO structure is deposited in thickness of about 50~65 Å using DCS and $NH_3$ gas under a low pressure of 1~3 torr at a temperature of about 650~800° C. by means of the LP-CVD method.

After the ONO process is implemented, in order to improve the quality of the ONO oxide film and enhance the interface between the respective layers, a steam anneal process may be implemented at a temperature of about 750~800° C. in a set oxidization mode so that the oxide film is oxidized in thickness of about 150~300 Å in case of a monitoring wafer. Furthermore, when the ONO process and the steam anneal process are implemented, they are implemented with no time delay within several hours among the respective processes, so that the ONO oxide film is prevented from being contaminated by a native oxide film or an impurity.

A third polysilicon film 30 has a dual structure of a doped film and an undoped film and is deposited using an amorphous silicon film at a temperature of about 510~550° C. under a pressure of 1.0~3 torr by means of the LP-CVD method, in order to prevent diffusion of fluoric acid that is substitutively solidified into the dielectric film 28 when the tungsten silicide film 32 is deposited and may increase the thickness of the oxide film. At this time, the ratio of the doped film and the undoped film is 1:2~6:1, and the amorphous silicon film is formed in thickness of about 500~1000 Å so that the gap between the floating gate electrodes 26 is sufficiently buried. Therefore, when the subsequent tungsten silicide film 24 is deposited, formation of a crack is prohibited and the word line resistance (Rs) could be thus reduced. When the third polysilicon film of the dual structure is formed, it is preferred that the doped film is formed using $SiH_4$ or $Si_2H_6$ and $PH_3$ gas, $PH_3$ gas is then blocked and the undoped film is consecutively formed.

It is preferred that the tungsten suicide film 32 is grown in stoichiometry of about 2.0~2.8, which can implement an adequate step coverage and minimize the word line resistance (Rs), at a temperature of 300~500° C. using reaction of $MS(SiH_4)$ or $DCS(SiH_2CL_2)$ and $WF_6$ containing low fluorine and having a low post annealed stress and a good adhesive strength.

An ACR layer (not shown) is deposited on the tungsten silicide film 32 using $SiO_xN_y$ or $Si_3N_4$. A gate mask and etching process and a self aligned mask and etching process are implemented to form a control gate electrode.

As described above, according to the present invention, the floating gate, which was formed through the existing mask and etch processes, is formed by forming oxide film protrusions on a field oxide film and forming a floating gate between the oxide film protrusions. Therefore, the present invention has advantageous effects that it can minimize the critical dimension of the device, facilitate the size of the device and can form a uniform floating gate over the wafer.

Furthermore, the present invention has new effects that it can improve characteristics of the flash memory devices since the difference of the coupling ratio between the cells is reduced due to the uniform floating gate and can maximize the coupling ratio since the active critical dimension is small.

In addition, the conventional mask process is obviated. Therefore, the present invention has new effects that it can solve problems that may occur in the masking process, simplify the process, improve the yield and reduce the cost price.

Incidentally, the present invention has an advantageous effect that it can easily secure various process margins by controlling the height and distance of the oxide film protrusion.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a semiconductor device, comprising:
   (a) sequentially forming a tunnel oxide film, a first polysilicon film and a pad nitride film on a semiconductor substrate;
   (b) etching portions of the pad nitride film, the first polysilicon film, the tunnel oxide film and the semiconductor substrate by means of a patterning process to form a trench within the semiconductor substrate;
   (c) depositing an oxide film on the entire structure including the trench and then planarizing the oxide film so that the pad nitride film is exposed;
   (d) etching the pad nitride film to form an oxide film protrusion;
   (e) depositing a second polysilicon film on the entire structure and then planarizing the second polysilicon film so that the oxide film protrusion is exposed, thereby forming a floating gate having the second polysilicon film formed on the first polysilicon film; and
   (f) etching a part of the exposed oxide film protrusion to improve a coupling ratio, and then forming a dielectric film and a control gate.

2. The method as claimed in claim 1, wherein the first polysilicon film is formed in thickness of 200~1000 Å using $SiH_4$ or $Si_2H_6$ and $PH_3$ gas by means of CVD, LPCVD, PECVD or APCVD method at a temperature of 530~680° C. under a pressure of 0.1~3.0 torr.

3. The method as claimed in claim 1, wherein the tunnel oxide film is deposited in thickness of 85~110 Å at a temperature of 750~800° C. by means of wet oxidization and is then experienced by annealing using $N_2$ at a temperature of 900~910° C. for 20~30 minutes.

4. The method as claimed in claim 1, further comprising before (a), implementing an ion implantation process to form a well within the semiconductor substrate.

5. The method as claimed in claim 1, further comprising between (b) and (c);
   implementing a sidewall oxidization process for compensating for damage of the semiconductor substrate that occurred upon formation of the trench;
   implementing a rapid thermal process for making rounded the corner of the trench; and
   depositing a high temperature oxide film on the entire structure and then implementing a densification process at high temperature.

6. The method as claimed in claim 1, further comprising between (d) and (e), implementing a wet cleaning process for preventing the tunnel oxide film from being lost, to remove the first polysilicon film in thickness of about 100~700 Å.

7. The method as claimed in claim 1, wherein (e) comprises:
   depositing a second polysilicon film on the entire structure;

depositing a buffer layer on the second polysilicon film for reducing a top surface of the second polysilicon film; and implementing a chemical mechanical polishing (CMP) process using the oxide film protrusion as a stop layer to smooth the buffer layer and the second polysilicon film.

8. The method as claimed in claim 7, wherein the buffer layer is at least one of a PE-TEOS layer, a PE-Nit layer, a PSG layer and a BPSG layer, which are formed by a PE-CVD method.

9. The method as claimed in claim 1, wherein the second polysilicon film is formed in thickness of 800~2500 Å using $SiH_4$ or $Si_2H_6$ and $PH_3$ gas by means of a CVD, LPCVD, PECVD or APCVD method at a temperature of 530~680° C. under a pressure of 0.1~3.0 torr.

10. A method of manufacturing a semiconductor device, comprising:
 (a) sequentially forming a tunnel oxide film, a first polysilicon film and a pad nitride film on a semiconductor substrate;
 (b) etching portions of the pad nitride film, the first polysilicon film, the tunnel oxide film and the semiconductor substrate by a patterning process to form a trench within the semiconductor substrate;
 (c) depositing an oxide film on the entire structure including the trench and then planarizing the oxide film so that the pad nitride film is exposed;
 (d) etching the pad nitride film to form an oxide film protrusion;
 (e) depositing a second polysilicon film on the entire structure and then removing the second polysilicon film on the oxide film protrusion by means of chemical mechanical polishing (CMP) process, thereby forming a floating gate having the second polysilicon film formed on the first polysilicon film; and
 (f) removing a thickness of the exposed oxide film protrusion by a pre-treatment cleaning process to improve a coupling ratio, and then forming a dielectric film and a control gate.

11. The method as claimed in claim 10, wherein the first polysilicon film is formed in thickness of 200~1000 Å using $SiH_4$ or $Si_2H_6$ and $PH_3$ gas by means of CVD, LPCVD, PECVD or APCVD method at a temperature of 530~680° C. under a pressure of 0.1~3.0 torr.

12. The method as claimed in claim 10, wherein the tunnel oxide film is deposited in thickness of 85~110 Å at a temperature of 750~800° C. by means of wet oxidization and is then annealed using $N_2$ at a temperature of 900~910° C. for 20~30 minutes.

13. The method as claimed in claim 10, further comprising before (a), implementing an ion implantation process to form a well within the semiconductor substrate.

14. The method as claimed in claim 10, further comprising between (b) and (c):
 implementing a sidewall oxidization process for compensating for damage of the semiconductor substrate that occurred upon formation of the trench;
 implementing a rapid thermal process for making rounded the corner of the trench; and
 depositing a high temperature oxide film on the entire structure and then implementing a densification process at high temperature.

15. The method as claimed in claim 10, further comprising between (d) and (e), implementing a wet cleaning process for preventing the tunnel oxide film from being lost, to remove the first polysilicon film in thickness of about 100~700 Å.

16. The method as claimed in claim 10, wherein (e) comprises:
 depositing a second polysilicon film on the entire structure;
 depositing a buffer layer on the second polysilicon film for reducing a top surface of the second polysilicon film; and
 implementing the chemical mechanical polishing (CMP) process using the oxide film protrusion as a stop layer to smooth the buffer layer and the second polysilicon film.

17. The method as claimed in claim 16, wherein the buffer layer is at least one of a PE-TEOS layer, a PE-Nit layer, a PSG layer and a BPSG layer, which are formed by a PE-CVD method.

18. The method as claimed in claim 10, wherein the second polysilicon film is formed in thickness of 800~2500 Å using $SiH_4$ or $Si_2H_6$ and $PH_3$ gas by means of a CVD, LPCVD, PECVD or APCVD method at a temperature of 530~680° C. under a pressure of 0.1~3.0 torr.

19. The method as claimed in claim 10, wherein the pre-treatment cleaning process is performed using HF or buffered oxide etchant.

* * * * *